(12) United States Patent
Fujii

(10) Patent No.: US 11,239,063 B2
(45) Date of Patent: Feb. 1, 2022

(54) VACUUM PROCESSING APPARATUS

(71) Applicant: ULVAC, INC., Kanagawa (JP)

(72) Inventor: Yoshinori Fujii, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 16/973,291

(22) PCT Filed: Jul. 23, 2019

(86) PCT No.: PCT/JP2019/028821
§ 371 (c)(1),
(2) Date: Dec. 8, 2020

(87) PCT Pub. No.: WO2020/090164
PCT Pub. Date: May 7, 2020

(65) Prior Publication Data
US 2021/0249237 A1    Aug. 12, 2021

(30) Foreign Application Priority Data

Oct. 30, 2018   (JP) .............................. JP2018-204377

(51) Int. Cl.
*H01J 37/32* (2006.01)
*C23C 14/35* (2006.01)
(Continued)

(52) U.S. Cl.
CPC ........ *H01J 37/32724* (2013.01); *C23C 14/35* (2013.01); *C23C 14/50* (2013.01);
(Continued)

(58) Field of Classification Search
CPC ......... C23C 14/00; C23C 14/34; C23C 14/35; C23C 14/50; C23C 14/541;
(Continued)

(56) References Cited

U.S. PATENT DOCUMENTS 6,423,192 B1 * 7/2002 Wada .................... C23C 14/046
204/192.12
2005/0184055 A1    8/2005 Natsuhara et al.

FOREIGN PATENT DOCUMENTS

EP        0 679 730 A1 *  2/1995
JP        7-194965 A      8/1995
(Continued)

OTHER PUBLICATIONS

International Search Report for PCT Patent App. No. PCT/JP2019/028821 (dated Sep. 17, 2019) with English language translation.

*Primary Examiner* — Rodney G McDonald
(74) *Attorney, Agent, or Firm* — Cermak Nakajima & McGowan LLP; Tomoko Nakajima

(57) ABSTRACT

A magnet unit for a magnetron sputtering apparatus is disposed above the target has: a yoke made of magnetic material and is disposed to lie opposite to the target; and plural pieces of magnets disposed on a lower surface of the yoke, wherein a leakage magnetic field in which a line passing through a position where the vertical component of the magnetic field becomes zero is closed in an endless manner, is caused to locally act on such a lower space of the target as is positioned between the center of the target and a periphery thereof, the magnet unit being driven for rotation about the center of the target. In a predetermined position of the yoke there is formed a recessed groove in a circumferentially elongated manner along an imaginary circle with the center of the target serving as a center.

4 Claims, 2 Drawing Sheets

(51) Int. Cl.
   *C23C 14/50*      (2006.01)
   *C23C 14/54*      (2006.01)
(52) U.S. Cl.
   CPC ..... *C23C 14/541* (2013.01); *H01J 2237/2007* (2013.01); *H01J 2237/332* (2013.01)
(58) Field of Classification Search
   CPC ......... H01J 37/32724; H01J 2237/2007; H01J 2237/332; H01L 21/203; H01L 21/285
   USPC ....... 204/298.11, 298.09; 118/725, 720, 721; 156/345.51, 345.52
   See application file for complete search history.

(56)  References Cited

FOREIGN PATENT DOCUMENTS

| | | |
|---|---|---|
| JP | 2005-158270 A | 6/2005 |
| JP | 2014-091861 A | 5/2014 |
| JP | 2015-000994 A | 1/2015 |
| JP | 2018-095918 A | 6/2018 |

\* cited by examiner

VACUUM PROCESSING APPARATUS

This application is a national phase entry under 35 U.S.C. § 371 of PCT Patent Application No. PCT/JP2019/028821, filed on Jul. 23, 2019, which claims priority under 35 U.S.C. § 119 to Japanese Patent Application No. 2018-204377, filed on Oct. 30, 2018, both of which are incorporated by reference.

TECHNICAL FIELD

The present invention relates to a vacuum processing apparatus having: a vacuum chamber which is capable of forming therein a vacuum atmosphere; and a stage inside the vacuum chamber, on whose stage is disposed a substrate to be processed (hereinafter referred to as a "to-be-processed substrate").

BACKGROUND ART

In a manufacturing step, e.g., of semiconductor devices, there is a step in which a predetermined vacuum processing is performed on a to-be-processed substrate such as a silicon wafer, the vacuum processing being performed inside a vacuum chamber that is capable of forming a vacuum atmosphere. In this kind of vacuum processing there are utilized a film forming apparatus: by a vacuum evaporation method; an ion plating method; a sputtering method or a plasma CVD method, a dry etching apparatus, a vacuum heat treatment apparatus, and the like. For example, the vacuum processing apparatus (sputtering apparatus) for performing film forming by the sputtering method has: a vacuum chamber which is capable of forming a vacuum atmosphere; and a sputtering target which is disposed on an upper part of the vacuum chamber. On a lower part of the vacuum chamber there is provided a stage for disposing thereon a to-be-processed substrate in a manner to lie opposite to the target.

The stage is provided with: a base made of metal and having a contour, e.g., of a cylinder to correspond to the contour of the to-be-processed substrate; and a chuck plate which is disposed on an upper surface of the base and which is smaller than the external dimension of the substrate (see, e.g., patent document 1). During film formation, in case the to-be-processed substrate is controlled to a predetermined temperature range above the room temperature, the following is generally known to the public, i.e.: a hot plate made, e.g., of aluminum nitride is interposed between the base and the chuck plate; also a coolant circulation passage for circulating a coolant inside the base is disposed; and the to-be-processed substrate is controlled to a predetermined temperature range by the heat transmission through the hot plate. By the way, the hot plate can be disposed integrally with the chuck plate.

In forming a predetermined thin film on the to-be-processed substrate by using the above-mentioned sputtering apparatus, in a state in which the to-be-processed substrate is kept electrostatically sucked (adsorbed) by the chuck plate, an inert gas (and a reactive gas) are introduced into the vacuum chamber in a vacuum atmosphere, and electric power having, e.g., a negative electric potential is applied to the target. Depending on the necessity, the hot plate is heated or a coolant is caused to be circulated through the passage provided inside the base so that, by heat transmission through the hot plate, the to-be-processed substrate is controlled to a predetermined temperature which is higher than the room temperature. According to this arrangement, a plasma atmosphere is formed inside the vacuum chamber; such ions of the inert gas as are ionized in the plasma get collided with the target and, consequently, the target gets sputtered; the sputtered particles (substances being generated by the vacuum processing inside the vacuum chamber) splashed from the target get adhered to, and deposited on, the surface of the to-be-processed substrate, whereby a predetermined thin film is formed depending on the kind of target.

When the target is sputtered, sputtered particles get splashed from the surface of the target according to the predetermined cosine law. The sputtered particles will be partly splashed also toward other than the to-be-processed substrate. Therefore, in order to prevent the sputtered particles (substances that are generated by the vacuum processing) from getting adhered to the inner walls of the vacuum chamber, the vacuum chamber is ordinarily provided with: deposition preventing plates made of metal and; around the base and the chuck plate, an annular shield plate called a platen ring which covers such an upper surface portion of the base as is exposed radially outward, while keeping a clearance therebetween.

Here, in case a film is formed on the to-be-processed substrate by the above-mentioned sputtering apparatus under the conditions of heating by the hot plate, it has been found that there are cases where a thin film having desired film quality cannot be formed. Then, as a result of strenuous studies, the inventor of this application has obtained the following findings in: that, depending on the heating temperature of the hot plate, such a surface portion of the platen ring as lies opposite to the hot plate is heated due to radiation from the hot plate, so that various gases (oxygen, water vapor, and the like) are ejected; and that these ejected gases are taken in the thin film, thereby resulting in deterioration of the film quality. These kinds of ejected gases are considered to give bad effect such as possible changes in the etching shape when the to-be-processed substrate is dry-etched by a dry etching apparatus.

PRIOR ART DOCUMENTS

Patent Documents

Patent Document 1: JP-2014-91861-A

SUMMARY OF THE INVENTION

Problems that the Invention is to Solve

This invention has been made based on the above-mentioned finding and has a problem of providing a vacuum processing apparatus as noted below, i.e., in case vacuum processing is performed while controlling, by a hot plate, the to-be-processed substrate disposed on a stage, to a predetermined temperature above the room temperature, there is provided the vacuum processing apparatus which can suppress to the best extent possible an adverse effect on the vacuum processing such, for example, as bringing about the deterioration of the film quality.

Means for Solving the Problems

In order to solve the above-mentioned problem, this invention is a vacuum processing apparatus comprising a vacuum chamber capable of forming therein a vacuum atmosphere, and a stage inside the vacuum chamber, the stage being adapted to dispose thereon a to-be-processed substrate. The stage has a base and a hot plate disposed on the base so as to enable to heat the to-be-processed substrate. The vacuum processing apparatus further comprises a platen ring and a deposition preventing plate both being made of metal and surrounding the hot plate with a predetermined clearance therebetween. Such a surface portion of the platen ring as lies opposite to the hot plate is made up of (or constituted by) a low-emissivity layer having a lowered emissivity as a result of a surface treatment to a parent metal of the platen ring.

According to this invention, since such a surface portion of the platen ring as lies opposite to the hot plate is made up of a low-emissivity layer, when the platen ring is subjected to vacuum processing under the conditions of heating by the hot plate, the heat rays to be ejected from the hot plate can be reflected. Therefore, the temperature rise of the platen ring itself can be suppressed. As a result, the gas ejection from the platen ring can be suppressed to the best extent possible. For example, there can be prevented from occurring such disadvantages as bringing about the deterioration of the film quality as a result, e.g., of inclusion of the ejected gas into the thin film to be formed. In this invention, the low-emissivity layer may include: one formed by subjecting the parent metal surface itself of the platen ring to a surface treatment by a known method such as mirror finishing, and the like; or one formed as a separate body by subjecting the parent metal surface of the platen ring to a surface treatment by a known method such as thermal spraying and the like. For example, in case the platen ring is made of stainless steel, the platen ring may be subjected to mirror finishing so as to attain the arithmetic average roughness Ra in a range of 0.01 to 2.00, and then the temperature rise of the platen ring may effectively be suppressed. Further, in case the platen ring is said to surround the hot plate with a predetermined clearance, it means that the thermal transmission by radiation becomes dominant between the hot plate and the platen ring. This includes a case in which the hot plate and the platen ring are locally brought into contact with each other due, e.g., to deformation, assembly error, and the like of the hot plate and the platen ring.

Further, in this invention, in case the deposition preventing plate has a portion which lies opposite to the platen ring while keeping a clearance to the platen ring, such a surface portion of the platen ring as lies opposite to the deposition preventing plate is made up of a high-emissivity layer having an emissivity higher than that of the low-emissivity layer. According to this arrangement, the deposition preventing plate can be suppressed from being heated by the radiation from the platen ring. In turn, the gas ejection accompanied by the temperature rise in the deposition preventing plate can be suppressed to the best extent possible, and the occurrence of such a disadvantage as bringing about, e.g., the deterioration of the film quality as a consequence of taking in the ejected gas into the thin film can be all the more prevented. In this case, if such a surface of the portion of the deposition preventing plate as lies opposite to the platen ring has an emissivity equivalent to that of the low-emissivity layer of the platen ring, the deposition preventing plate can advantageously be suppressed from getting heated more effectively.

By the way, in this invention, the emissivity of the low-emissivity layer shall preferably be below 0.3. For example, in case the platen ring and/or the deposition preventing plate is made of stainless steel, the mirror finishing can be applied in a known method to attain an arithmetic average roughness Ra in a range of 0.01 to 2.00 in order to make the emissivity of the surface of the platen ring or the deposition preventing plate below 0.3. Here, the emissivity of the surface means an average emissivity within a range of wavelengths of 2 to 6 μm. In this case, if the emissivity exceeds 0.2, when the hot plate itself is heated, for example, to a predetermined temperature in a range of 300° C. to 500° C., there is a possibility that the heat rays to be ejected from the hot plate cannot effectively be reflected and thus the temperature rise of the platen ring itself cannot be suppressed. Therefore, the emissivity of the low-emissivity layer shall more preferably be below 0.2. In addition, in order to make the emissivity below 0.03, the machining cost will increase beyond the practical level and, therefore, the lower limit of the emissivity of the low-emissivity layer can be set above 0.03. On the other hand, the emissivity of the high-emissivity layer shall preferably be above 0.5. In case the platen ring and/or the deposition preventing plate is made of stainless steel, processing by blasting using the particles within a range of particle diameters, e.g., of 90 to 710 μm, the emissivity of the surface can be made above 0.5.

MODES FOR CARRYING OUT THE INVENTION

With reference to the drawings, a description will hereinafter be made of an embodiment of a vacuum processing apparatus by citing an example in which, provided that the vacuum processing apparatus is a magnetron type of sputtering apparatus, and that the to-be-processed substrate is a silicon wafer (hereinafter referred to as "substrate Sw"), a predetermined thin film is formed on a surface of the substrate Sw. In the following description, the terms denoting the direction shall be based on the posture of installation of the sputtering apparatus SM as the vacuum processing apparatus as shown in FIG. 1.

Figure 1:
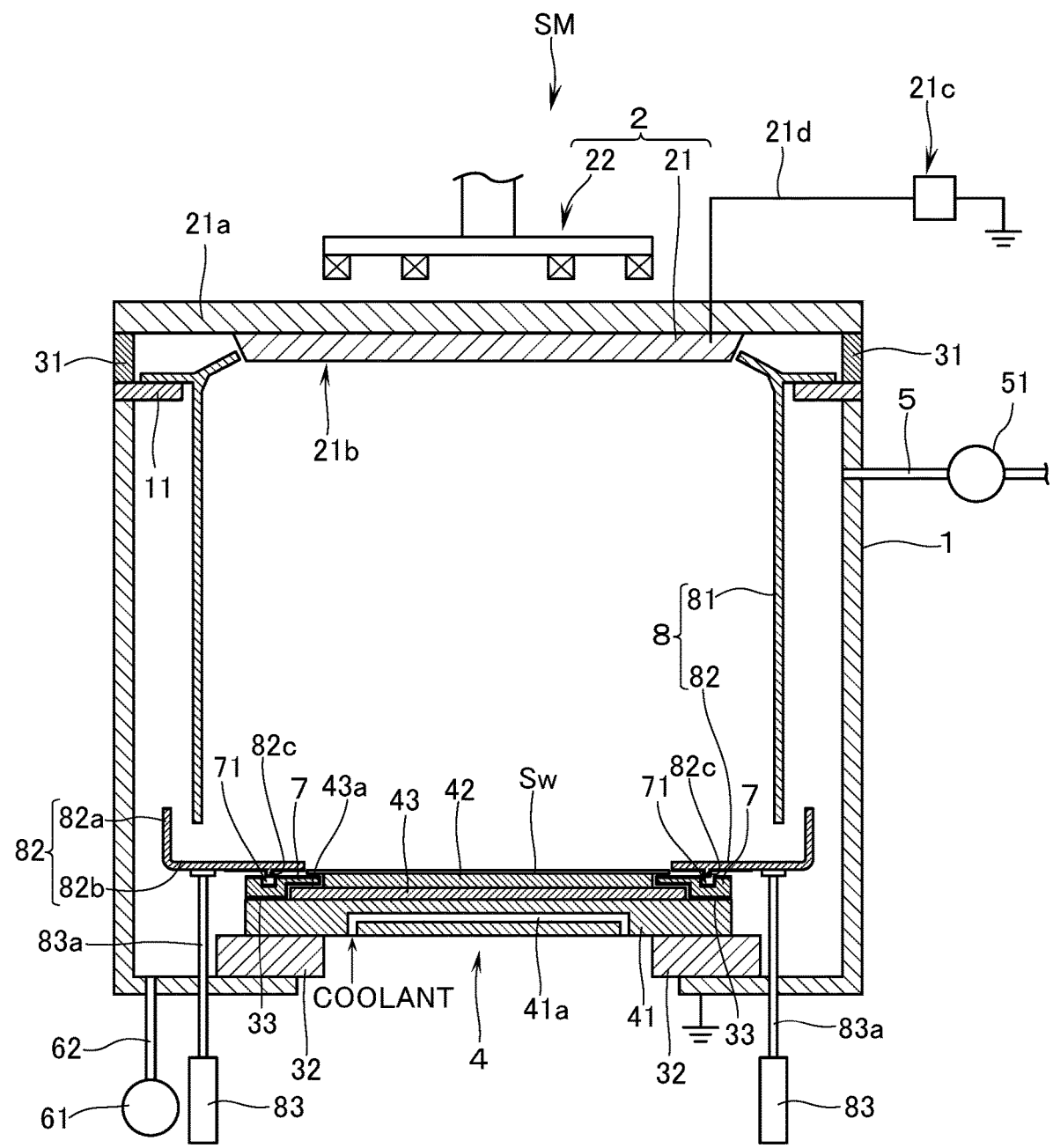
FIG. 1 is a schematic sectional view showing a sputtering apparatus according to an embodiment of this invention.

With reference to FIG. 1, the mark SM denotes a sputtering apparatus according to this embodiment. The sputtering apparatus SM is provided with a vacuum chamber 1. In an upper opening of the vacuum chamber 1, a cathode unit 2 is detachably mounted. The cathode unit 2 is made up of a target 21, and a magnet unit 22 which is disposed above the target 21. As the target 21 there will be utilized known one of aluminum, copper, titanium, aluminum oxide, and the like. As to the target 21, in a state in which it is mounted on a backing plate 21a and in a posture in which the sputtering surface 21b (i.e., the surface to get sputtered) looks downward, the target 21 is mounted on an upper part of the vacuum chamber 1 through an insulating body 31 which is disposed on the upper wall of the vacuum chamber 1 and which also serves the purpose of a vacuum seal.

The target 21 has connected thereto an output 21d from a sputtering power supply 21c which is constituted by a DC power supply, an AC power supply, and the like depending on the kind of the target. Depending on the kind of the target, it is so arranged that a predetermined power having, e.g., a negative electric potential or a high-frequency power of a predetermined frequency can be supplied to the target 21. The magnet unit 22 has a known closed magnetic field or cusp magnetic field structure which generates a magnetic field in a space below the sputtering surface 21b of the target 21, collects the ions ionized below the sputtering surface 21b at the time of sputtering so as to efficiently ionize the sputtered particles splashed from the target 21.

At the bottom of the vacuum chamber 1, there is disposed a stage 4 in a manner to lie opposite to the target 21. The stage 4 is made up of: a metal base 41 which is disposed through an insulating body 32 provided at the bottom of the vacuum chamber 1 and which has a cylindrical contour; and a chuck plate 42 which is glued to the upper surface of the base 41. The chuck plate 42, which is made, e.g., of aluminum nitride and has an outer diameter which is slightly smaller than the upper surface of the base 41. Although not explained in particular with illustration, the chuck plate 42 has buried therein electrodes for an electrostatic chuck. It is thus so arranged that, when voltage is applied to the electrodes from an electric power supply (not illustrated), the substrate Sw is electrostatically sucked (adsorbed) to the upper surface of the chuck plate 42. Further, the base 41 has formed therein a coolant circulation passage 41 which circulates the coolant from a chiller unit (not illustrated). Between the base 41 and the chuck plate 42, there is interposed a hot plate 43 made, e.g., of aluminum nitride so as to be heated through energization to a predetermined temperature (e.g., 300° C. to 500° C.). In this case, it is also possible to embed a heater inside the chuck plate 42 so as to form the chuck plate 42 and the hot plate 43 integrally. It is thus so arranged that the substrate Sw is controlled within a predetermined temperature range above the room temperature by the heating with the hot plate 43 and by the cooling of the base 41 with the circulation of the coolant through the coolant circulation passage 41*a*.

A side wall of the vacuum chamber 1 has connected thereto a gas pipe 5 for introducing a sputtering gas, and the gas pipe 5 is communicated with a gas source (not illustrated) through a mass flow controller 51. The sputtering gas includes not only an inert gas such as argon gas and the like that is introduced at the time of forming a plasma in the vacuum chamber 1, but also a reactive gas such as oxygen gas, nitrogen gas, and the like. Further, a lower wall of the vacuum chamber 1 has connected thereto an exhaust pipe 62 which is in communication with a vacuum pump 61 which is made up of a turbo molecular pump, a rotary pump, and the like. It is thus so arranged that the vacuum chamber 1 is evacuated at a constant speed so as to maintain the vacuum chamber 1 at a predetermined pressure in a state in which the sputtering gas remains introduced at the time of sputtering.

Around the stage 4 inside the vacuum chamber 1, there is provided, at a clearance therefrom, a platen ring 7 which serves as a deposition preventing plate in a manner to cover the base 41 which is exposed radially outward and, further, an upper surface portion 43*a* of the hot plate 43. The platen ring 7 is made of a known material such as aluminum oxide, stainless steel and the like, and is disposed around the peripheral portion on the upper surface of the base 41 through an insulating body 33. Although not explained by illustration, the platen ring 7 is provided, on a lower surface thereof, with a plurality of engaging projections at a circumferential distance from one another and, on an upper surface of the insulating body 33, is provided with receiving holes which engagingly accept the engaging projections. It is thus so arranged that, when the engaging projections are brought into engagement with the receiving holes, the platen ring 7 is fixed to the insulating body 33. The upper surface of the platen ring 7 is arranged to be substantially flush with the upper surface of the chuck plate 42. Further, the vacuum chamber 1 is provided inside thereof with a metallic deposition preventing plate 8 for preventing the sputtered particles, as the substances that are generated by sputtering of the target 21, from getting adhered to the inner wall surface of the vacuum chamber 1.

The deposition preventing plate 8 is made up of an upper deposition preventing plate 81 and a lower deposition preventing plate 82, each being made of a known material such as aluminum oxide, stainless steel and the like. The upper deposition preventing plate 81 has a cylindrical contour and is suspended through an engaging part 11 provided on an upper part of the vacuum chamber 1. The lower deposition preventing plate 82 has also a cylindrical contour and, on a free end on the radially outside, has formed an erected wall part 82*a* which is erected upward. The lower deposition preventing plate 82 has connected thereto a drive shaft 83*a* from a driving means 83 such as a motor, an air cylinder, and the like, the drive shaft 83*a* extending through a lower wall of the vacuum chamber 1. By the driving means 83 the lower deposition preventing plate 82 can be moved up and down between: a film forming position in which the film forming is performed by sputtering; and a transport position in which the lower deposition preventing plate 82 is lifted from the film forming position to a predetermined height, thereby handing over a substrate Sw to the stage 4 by means of a vacuum robot (not illustrated). It is so designed that, at the film forming position, the lower end part of the upper deposition preventing plate 81 and the upper end part of the erected wall part 82*a* are overlapped with each other in the vertical direction.

Such a flat part 82*b* of the lower deposition preventing plate 82 as extends at right angles in the vertical direction is sized such that the diametrically (right-and-left direction in FIG. 1) inside part lies opposite to the platen ring 7. The flat part 82*b* has formed, e.g., one annular projection 82*c* in a predetermined position on the lower surface. An upper surface of the platen ring 7 has formed therein an annular recessed groove 71 in a manner to correspond to each projection 82*c*. Then, at the film forming position, the projection 82*c* of the flat part 82*b* and the recessed groove 71 of the platen ring 7 form a so-called labyrinth seal. It is thus so arranged that the sputtered particles can be prevented from wrapping (turning) around into the space inside the vacuum chamber 1 that is positioned below the lower deposition preventing plate 82 in the circumference of the substrate Sw. A description will now be made of an example of a method of forming an aluminum film on the surface of the substrate Sw by the above-mentioned sputtering apparatus SM, with the target being defined as aluminum.

After having set in position, inside the vacuum chamber 1, various kinds of constituting parts such as the target 21, the platen ring 7, the deposition preventing plate 8, and the like, the vacuum pump 61 is operated to evacuate the hermetically sealed vacuum chamber 1. Then, at the transfer position of the lower deposition preventing plate 82, a substrate Sw is transferred by a vacuum transfer robot (not illustrated) onto the stage 4, and the substrate Sw is mounted on the upper surface of the chuck plate 42. Once the vacuum transfer robot has retreated, the lower deposition preventing plate 82 is moved to the film forming position so as to prevent the sputtered particles from getting adhered to the inner wall of the vacuum chamber 1. Then, a predetermined voltage is applied from the chuck power supply to the electrodes for the electrostatic chuck. The substrate Sw is electrostatically sucked to the chuck plate 42. Together with this, the substrate Sw is controlled to a predetermined temperature above the room temperature (e.g., 350° C.) as a result of heating by the hot plate 43 and as a result of cooling of the substrate Sw by the circulation of cooling medium to the coolant circulation passage 41*a*.

The vacuum chamber 1 is evacuated inside thereof to a predetermined pressure (e.g., $10^{-5}$ Pa) and also, when the substrate Sw has attained a predetermined temperature, argon gas as a sputtering gas is introduced in a certain amount (e.g., argon partial pressure of 0.5 Pa) through the gas pipe 5. Together with the above, a predetermined power (e.g., 3 to 50 kW) with negative electric potential is supplied from the sputtering power supply 21*c* to the target 21. According to these operations, a plasma is formed inside the vacuum chamber 1, the sputtering surface 21*b* of the target gets sputtered by the ions of the argon gas in the plasma, and the sputtered particles from the target 21 get adhered to, and deposited on, the substrate Sw, thereby forming an aluminum film.

It is to be noted here that, when a film is formed on the substrate Sw under the state of heating by the hot plate 43, such a surface portion of the platen ring 7 as lies opposite to the hot plate 43 will be heated due to radiation from the hot plate 43. When the surface portion of the platen ring 7 is heated, such the flat part 82*b* of the lower deposition preventing plate 82 as lies opposite to the platen ring 7 will also be heated. At this time, the sputtered particles (aluminum) will not ordinarily be adhered to the surface portion of the platen ring 7 and to the lower surface of the flat part 82*b*. In other words, they will not be covered by an aluminum film. Therefore, when the surface portion of the platen ring 7 exceeds a predetermined temperature (for example, after having set in position the platen ring 7 and the deposition preventing plate 8 inside the vacuum chamber 1, the heating temperature at the time of baking for degassing that is performed prior to the film formation) and keeps on increasing in temperature, various residual gases (oxygen, water vapor and the like) remaining on the surface without vacuum evacuation, will be ejected. If these ejected gases are taken into the thin film during the film formation by sputtering, deterioration of the film quality will be incurred. Therefore, such an occurrence must be suppressed to the best extent possible.

Figure 2:
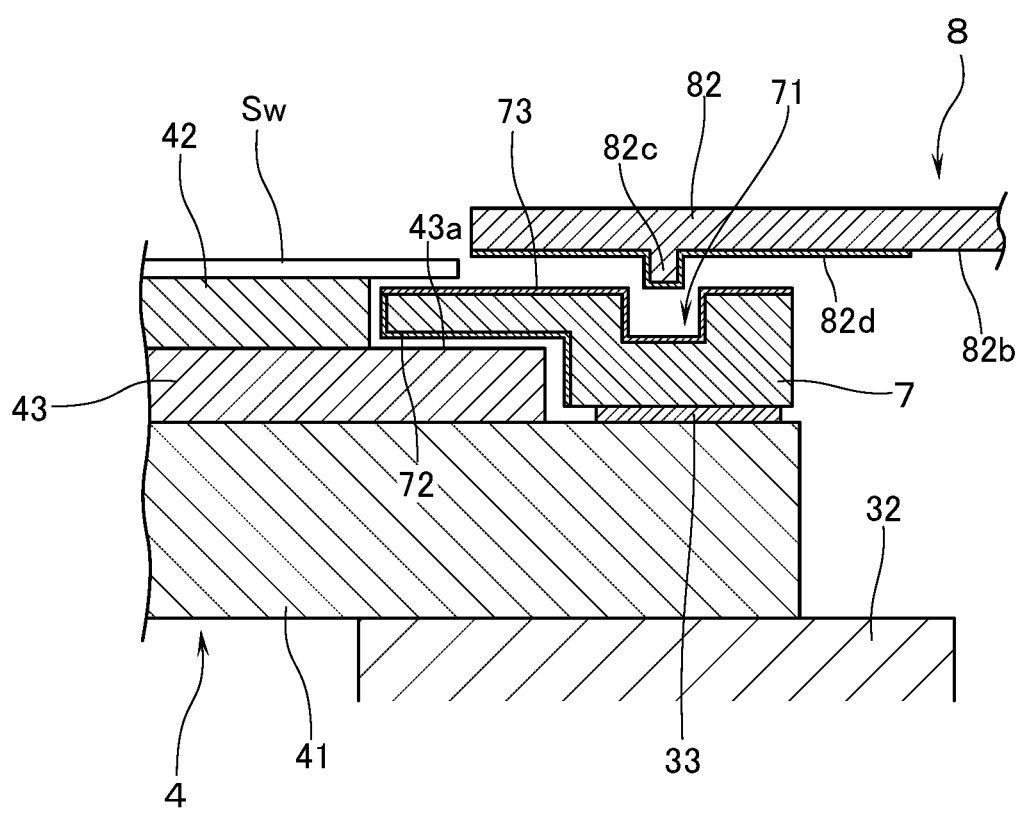
FIG. 2 is a sectional view showing in enlargement a part of FIG. 1.

In this embodiment, as shown in FIG. 2, such a surface portion of the platen ring 7 as lies opposite to the hot plate 43 is made up of a low-emissivity layer 72 whose emissivity is below 0.3 as a result of a predetermined surface treatment to the parent material thereof. In concrete, the low-emissivity layer 72 is formed by subjecting the surface of the platen ring 7 to the known mirror-finishing such as polishing or cutting so that the arithmetic average roughness Ra becomes a range of 0.01 to 2.00 relative to the surface of the platen ring 7. Here, the emissivity denotes an average emissivity within a range of wavelength of 2 to 6 nm. In this case, more preferably the emissivity of the low-emissivity layer 72 shall be below 0.2. If the emissivity exceeds 0.2, when, e.g., the hot plate 43 itself is heated to a predetermined temperature within a range of 300° C. to 500° C., the heat rays to be ejected from the hot plate 43 cannot effectively be reflected, and there is a possibility that the temperature rise in the platen ring 7 itself cannot be suppressed. In addition, in order to reduce the emissivity below 0.03, the machining cost will increase beyond realistic level and, therefore, the lower limit of the emissivity of the low-emissivity layer 72 may be set above 0.03. The low-emissivity layer 72 may be formed at least on such a surface portion of the platen ring 7 as lies opposite to the hot plate 43. It is, however, also acceptable to form the low-emissivity layer over the entirety of the lower surface of the platen ring 7. Further, such an upper surface portion of the platen ring 7 as lies opposite to the flat part 82*b* of the lower deposition preventing plate 82 is made up of a high-emissivity layer 73 whose emissivity is above 0.5. In concrete, by using a solid metal, mineral or vegetable abrasive powder (particles) whose particle diameter is in the range of 90 to 710 μm, blasting is applied to an upper surface portion of the platen ring 7, whereby the high-emissivity layer 73 is formed. The high-emissivity layer 73 may be formed at least in such an upper surface portion of the platen ring 7 as lies opposite to the flat part 82*b* of the lower deposition preventing plate 82 or, alternatively, it may be formed over the entire upper surface of the platen ring 7. In addition, the lower surface of the flat part 82*b* is also made up of a low-emissivity layer 82*d* whose emissivity is below 0.3, more preferably below 0.2 in a similar manner as the above. The lower limit of the emissivity of the low-emissivity layer 82*d* may also be set, in a similar manner as the above, to above 0.03.

According to the above-mentioned embodiment, since such a surface portion of the platen ring 7 as lies opposite to the hot plate 43 is made up of the low-emissivity layer 72, when a film is formed under heating conditions by the hot plate 43, the heat rays to be ejected from the hot plate 43 are reflected. Therefore, the temperature rise of the platen ring 7 itself can be suppressed. As a result, the gas ejection from the platen ring 7 can be suppressed to the best extent possible. For example, the problem of incurring the deterioration of film quality as a result, e.g., of the inclusion of the ejected gases into the thin film, can be prevented. In addition, by constituting such an upper surface portion of the platen ring 7 as lies opposite to the lower deposition preventing plate 82 by the high-emissivity layer 73, and by constituting the lower surface of the flat part 82*b* by the low-emissivity layer 82*d*, the lower deposition preventing plate 82 can be prevented from being heated by the radiation from the platen ring 7. Further, the gas ejection accompanied by the temperature rise of the lower deposition preventing plate 82 can be suppressed to the best extent possible. As a result, the possible disadvantage in that the ejected gases will be taken in the thin film, to thereby bring about, e.g., the deterioration in the film quality, can be more positively prevented. Here, an experiment was performed by: using the above-mentioned sputtering apparatus SM; setting the heating temperature by the hot plate 43 to 300° C.; and forming an aluminum film on a plurality of substrates Sw. It has then been confirmed that the temperature of the platen ring 7 could be lowered by about 60° C. and that the temperature of the lower deposition-preventing plate 82 could be lowered by about 30° C.

Descriptions have so far been made of the embodiment of this invention, but this invention shall not be limited to the above-described embodiment. As long as the substance of this invention is not deviated, various modifications are possible. In the above-mentioned embodiment, a description was made based on an example in which the sputtering apparatus SM was used, but as long as the vacuum processing apparatus is provided, inside the vacuum chamber, with a stage having a hot plate thereon and a platen ring around the stage, this invention need not be limited to the above, but can be applied, e.g., also to the dry etching apparatus.

Further, in the above-mentioned embodiment, a description was made of an example in which the low-emissivity layer 72, 82*d* is formed by subjecting the surface, e.g., of the platen ring 7 to a mirror finishing (surface treatment) so as to obtain the arithmetic average roughness Ra in a range of 0.01 to 2.00. But without being limited to the above, the low-emissivity layer made up of Al, Cu, Au and Pt can also be formed by subjecting the surface, e.g., of the platen ring 7 to a surface treatment such as thermal spraying, film forming and the like. In addition, as the method of mirror finishing, there may be employed singly or in combination known methods such as cutting operation, physical polishing such as buffing and the like and, beyond that, electrolytic polishing and chemical polishing. On the other hand, a description was made of an example in which a high-emissivity layer 73 was formed by performing blasting using solid metal within a range of particle diameters of 90 to 710 µm. However, without being limited thereto, there may be used, e.g., etching or embossing. Otherwise, by subjecting the surface, e.g., of the platen ring 7, e.g., to the surface treatment such as thermal spraying, film forming and the like, a high-emissivity layer made up of a non-metallic film such as AlTiN, $Al_2O_3$ and the like or thermal-sprayed film of Ti may be formed.

| EXPLANATION OF MARKS | | | |
|---|---|---|---|
| SM | sputtering apparatus (vacuum processing apparatus) | | |
| 1 | vacuum chamber | 4 stage | 41 base |
| 43 | hot plate | 7 platen ring | |
| 72 | low-emissivity layer | 73 high-emissivity layer | |
| 8 | deposition preventing plate | | |
| 82 | lower deposition preventive plate | | |
| 82d | low-emissivity layer | | |
| Sw | substrate (to-be-processed substrate) | | |

The invention claimed is:

1. A vacuum processing apparatus, comprising;
    a vacuum chamber capable of forming therein a vacuum atmosphere, and a stage inside the vacuum chamber, the stage being adapted to dispose thereon a to-be-processed substrate,
    the stage having a base and a hot plate disposed on the base so as to enable to heat the to-be-processed substrate; and
    a platen ring and a deposition preventing plate both being made of metal and surrounding the hot plate with a predetermined clearance therebetween,
    wherein a first surface portion of the platen ring, the first surface portion lying opposite to the hot plate is made up of a low-emissivity layer having a lowered emissivity as a result of a surface treatment to a parent metal of the platen ring,
    wherein the deposition preventing plate has a portion which lies opposite to the platen ring while keeping a clearance to the platen ring, and
    wherein a second surface portion of the platen ring, the second surface portion lying opposite to the deposition preventing plate, is made up of a high-emissivity layer having an emissivity higher than that of the low-emissivity layer.

2. The vacuum processing apparatus according to claim 1, wherein a surface of the portion of the deposition preventing plate, the surface lying opposite to the platen ring, has an emissivity equivalent to that of the low-emissivity layer of the platen ring.

3. The vacuum processing apparatus according to claim 1, wherein the emissivity of the low-emissivity layer is below 0.3.

4. The vacuum processing apparatus according to claim 1, wherein the emissivity of the high-emissivity layer is above 0.5.

* * * * *